(12) United States Patent
Kim et al.

(10) Patent No.: US 8,122,295 B2
(45) Date of Patent: Feb. 21, 2012

(54) MEMORY SYSTEMS AND METHODS OF DETECTING DISTRIBUTION OF UNSTABLE MEMORY CELLS

(75) Inventors: Seon-taek Kim, Suwon-si (KR);
Yoon-young Kyung, Paju-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/774,340

(22) Filed: May 5, 2010

(65) Prior Publication Data

US 2011/0083039 A1    Apr. 7, 2011

(30) Foreign Application Priority Data

Oct. 1, 2009   (KR) .................. 10-2009-0094047

(51) Int. Cl.
*G06F 11/00* (2006.01)
(52) U.S. Cl. ........... 714/42; 714/6.1; 714/6.11; 714/6.2; 714/6.24; 714/21
(58) Field of Classification Search .............. 714/6.1, 714/6.11, 6.2, 6.24, 21, 42
See application file for complete search history.

(56) References Cited

U.S. PATENT DOCUMENTS

| | | | |
|---|---|---|---|
| 6,912,155 B2 | 6/2005 | Sakurai et al. | |
| 7,426,136 B2 | 9/2008 | Sakurai et al. | |
| 7,558,107 B2 | 7/2009 | Sakurai et al. | |
| 7,568,135 B2* | 7/2009 | Cornwell et al. | 714/721 |
| 7,573,754 B2 | 8/2009 | Kim et al. | |
| 7,898,853 B2* | 3/2011 | Lee et al. | 365/185.03 |
| 2008/0104459 A1* | 5/2008 | Uchikawa et al. | 714/721 |
| 2009/0067237 A1* | 3/2009 | Lee et al. | 365/185.03 |
| 2009/0262581 A1 | 10/2009 | Sakurai et al. | |
| 2011/0066899 A1* | 3/2011 | Kang et al. | 714/54 |
| 2011/0126080 A1* | 5/2011 | Wan et al. | 714/763 |

FOREIGN PATENT DOCUMENTS

| | | |
|---|---|---|
| JP | 9-44416 A | 2/1997 |
| JP | 2001-331382 A | 11/2001 |
| JP | 2004-118908 A | 4/2004 |
| KR | 10-0736103 B1 | 6/2007 |

* cited by examiner

*Primary Examiner* — Charles Ehne
(74) *Attorney, Agent, or Firm* — Myers Bigel Sibley & Sajovec, P.A.

(57) ABSTRACT

A circuit is operated to detect unstable memory cells from among a plurality of memory cells in at least one page. A determination is made from an initial status of data stored in a memory cell whether no read error occurs when the data is read at a standard read voltage level, whether a read error occurs and the read error is correctable, and whether a read error occurs and the read error is uncorrectable. Responsive to determining that a read error occurs that is correctable, a further determination is made as to whether the memory cell is correctable by reading the data stored in the memory cell at a correction read voltage level, which has a different voltage level from the standard read voltage level, and by determining whether a read error occurring in the data read at the correction read voltage level is correctable or uncorrectable.

15 Claims, 7 Drawing Sheets

MEMORY SYSTEMS AND METHODS OF DETECTING DISTRIBUTION OF UNSTABLE MEMORY CELLS

CROSS-REFERENCE TO RELATED APPLICATIONS

This application claims the benefit of Korean Patent Application No. 10-2009-0094047, filed on Oct. 1, 2009, in the Korean Intellectual Property Office, the disclosure of which is incorporated herein in its entirety by reference.

BACKGROUND

The inventive concept relates to memory systems and related methods of detecting the distribution of unstable memory cells in memory systems.

Some computers used hard disc drives as a mass storage medium. Hard disc drives can provide large data storage capacities. However, when a hard disc drive receives an external shock, data stored in the disc may be lost. A hard disc drive reads and writes data through a head that is moved by an actuator, where the speed of reading inner portions of the disc is different from the speed of reading outer portions of the hard disc. Solid state discs (SSDs) that use flash memory are increasingly replacing hard disc drives for certain mass data storage applications. Data access speed is faster than in the case of the hard disc drives and, in particular, when several files are simultaneously read.

General memory systems include a memory that stores data, and a memory controller that controls the operation of the memory. A flash memory is a type of semiconductor memory that includes transistor memory cells, i.e., floating gate transistors, which store data. A programming operation is performed by accumulating a predetermined amount of charges in the floating gate. Single bit data or multi-bit data is stored in each memory cell. The memory cell in which the single bit data is stored has two voltage levels defined by the distribution of threshold voltages, and the memory cell in which the multi-bit data is stored has four or more voltage levels.

Single bits, i.e., logic 1 and logic 0, may be represented by a predetermined amount of charge accumulated in a floating gate of a transistor. In other words, a threshold voltage of the transistor is determined by the charges stored in the floating gate. Thus, when a signal at a predetermined voltage level is applied to a gate terminal of the transistor, a turned-on transistor and a turned-off transistor may be discriminated from each other. To read a single bit, a single type of read voltage level can be applied to the gate terminal of the transistor.

When multi-bits such as logic 00, 01, 10, and 11 are represented, the amount of charges to be accumulated on the floating gate should be divided into three types, and thus, three types of read voltage levels are needed. The charges that are stored in the floating gates of a flash memory should vary uniformly within an acceptable range as their mobility changes with temperature variation, stored charge is reduced over time, disturbances occur in adjacent cells during programming operations, and other effects. Thus, the amount of charges to be accumulated on the floating gate is adjusted in consideration of a predetermined margin between voltage levels from the programming operation to read voltage levels.

A basic unit for writing data in a flash memory cell is a page. In order to program a memory cell of the flash memory, a predetermined voltage should be applied to source, drain, gate, and bulk regions. However when power is suddenly turned off while a programming operation is being performed, the data being written may not be adequately stored in the page. The data stored in the page in this state may not be used and may be uncorrectable.

During a page read operation, the memory controller uses an error correction code (ECC) algorithm to determine whether an ECC error or a correctable ECC error is generated in page data. When the memory controller determines that the page is not normally programmed, the memory controller generates an uncorrectable ECC error signal so that the page data may be processed as invalid data. In other words, when it is determined that the page is being programmed before the power supply is cut off and due to the sudden cut off of the power supply, an error is generated, the page is processed as invalid data, and logical block address (LBA) data of a last write request is neglected.

However, when the programming operation is nearly completed, data stored in the page may be corrected. In this case, the memory controller generates a correctable ECC error signal so that the page may be used later. When the programming operation is nearly completed, at least a threshold amount of charge is accumulated on the floating gate. However, when the page is correctable and the data stored in the page is used without being completed, a read error may be generated when the data are read. In this case, since a correctable error signal is generated by the memory controller, a programming operation on the page is not performed later. Thus, the charges accumulated on the floating gate are insufficient.

The amount of charge accumulated on the floating gate may be reduced as a function of reading the stored data and due to natural leakage. When the amount of charge accumulated on the floating gate is not sufficient, data stored in a cell have a different value from the intended valued during the programming operation.

Thus, a method of blocking read errors that may occur when reading data stored in a page for which a programming operation is nearly completed is needed.

SUMMARY

According to some embodiments of the inventive concept, a memory system includes a solid state disc (SDD) and a memory controller. The SSD includes a plurality of memory cells. The memory controller writes data in the SDD or reads the data from the SDD. The memory controller applies a standard write voltage and a correction read voltage having a predetermined level difference with the standard read voltage to the SSD, and analyzes the distribution of data stored in the SSD using the standard read voltage and the correction read voltage, and determines whether data stored in the SSD is valid, and corrects the data stored in the SSD.

According to some other embodiments of the inventive concept, a memory system includes a memory and a memory controller for controlling the memory, wherein the memory controller reads data stored in a memory cell included in the memory or data stored in a memory page of the memory cell included in the memory by using a standard read voltage level and a correction read voltage level, detects a read error that occurs in the memory cell, reads data stored in the memory cell after a read voltage level is adjusted, in order to perform a function of determining whether the memory cell is used according to a detection result or data is to be newly stored in the memory cell, and detects a read error that occurs in the memory cell.

According to some other embodiments of the inventive concept, a method of detecting a distribution of unstable memory cells from among a plurality of memory cells in which pages of a single memory cell or the plurality of memory cells are included. The method includes a memory cell initial status checking operation and a memory cell correction determination operation. In the memory cell initial status checking operation, an initial status of data stored in a memory cell is checked, and it is determined according to a checking result whether no read error occurs when data stored in memory cells are read at a standard read voltage level, a read error occurs and the read error is correctable, or a read error occurs and the read error is uncorrectable. In the memory cell correction determination operation, if it is determined that the read error is correctable, it is determined whether the memory cell is correctable by reading the data stored in the memory cell at a correction read voltage level that has a different voltage level from the standard read voltage level, and it is determined whether a read error occurring when the data stored in the memory cells are read at the correction read voltage level is correctable or uncorrectable.

According to some other embodiments of the inventive concept, a method of detecting a distribution of unstable memory cells from among a plurality of memory cells in which pages of a single memory cell or the plurality of memory cells are included. The method includes a memory cell initial status checking operation and a memory cell correction determination operation. In the memory cell initial status checking operation, an initial status of data stored in a memory cell is checked, and it is determined according a checking result whether no read error occurs when data stored in memory cells are read at a standard read voltage level, a read error occurs and the read error is correctable, or a read error occurs and the read error is uncorrectable. In the memory cell correction determination operation, if it is determined that the read error is correctable, it is checked whether the memory cell is correctable by reading the data stored in the memory cell at a correction read voltage level that has a different voltage level from the standard read voltage level, and it is determined whether the read error occurring when the data stored in the memory cells are read at the correction read voltage level is correctable or uncorrectable. The memory cell correction determination operation is repeatedly performed by adjusting the correction read voltage level as at least two voltage levels, or the memory cell initial status checking operation and the memory cell correction determination operation are repeatedly performed on at least two pages. Alternatively, these two options are repeatedly performed.

Some other embodiments are directed to a method of operating a circuit to detect unstable memory cells from among a plurality of memory cells in at least one page of memory. The method includes determining from an initial status of data stored in a memory cell whether no read error occurs when the data is read at a standard read voltage level, whether a read error occurs and the read error is correctable, and whether a read error occurs and the read error is uncorrectable. Responsive to determining that a read error occurs that is correctable, a further determination is made as to whether the memory cell is correctable by reading the data stored in the memory cell at a correction read voltage level, which has a different voltage level from the standard read voltage level, and by determining whether a read error occurring in the data read at the correction read voltage level is correctable or uncorrectable.

In some further embodiments, a response to a determination that no read error occurs is made by determining that data stored in the memory cell or in a page of the memory cell is stable, and responding to a determination that the read error is uncorrectable by determining that data stored in the memory cell or in the page of the memory cell is not to be used for data access by a host device. The determining from an initial status of data stored in a memory cell can include determining from the initial status of the data stored in the memory cell whether an uncorrectable read error has occurred, and responsive to determining that no uncorrectable read error has occurred, determining whether there is no read error.

The determining from an initial status of data stored in a memory cell can include first determining a number of memory cells in which a correctable read error occurs when the data stored in the memory cells are read at the standard read voltage level. The further determining whether the memory cell is correctable can include determining whether a read error occurring when the data stored in the memory cells are read using the correction read voltage level is correctable or uncorrectable.

The determining whether a read error occurring when the data stored in the memory cells are read using the correction read voltage level is correctable or uncorrectable can include determining whether the read error is uncorrectable, responding to determining that read error is correctable by second determining a number of memory cells in which a correctable read error occurs when the data stored in the memory cells are read using the correction read voltage level, and determining whether the number of memory cells in which a correctable read error occurs when read at the correction read voltage level is larger than a number of memory cells in which a correctable read error occurs when read at the standard read voltage level.

Responsive to a determination that the read error is uncorrectable, a further determination is made that data in a memory cell or in a page of the memory is not to be used for data access by a host and restricting access by the host thereto (which may be carried out by a memory controller). Responsive to determining that the number of memory cells in which a correctable read error occurs when read at the correction read voltage level is larger than a number of memory cells in which a correctable read error occurs when read at the standard read voltage level, a further determination is made that the data stored in the memory cell or in the page of the memory cell is not to be used for data access by the host and restricting access by the host thereto. Responsive to the number of memory cells in which a correctable read error occurs when read at the correction read voltage level is less than the number of memory cells in which a correctable read error occurs when read at the standard read voltage level, a further determination is made that the data stored in the memory cell or in the page of the memory cell is stable and allowed to be accessed by the host.

The determining from an initial status of data stored in a memory cell and the determining whether the memory cell is correctable can be repeatedly performed on a plurality of pages. The determining whether the memory cell is correctable can include repetitively reading the memory cell at a plurality of different voltage levels.

Some other embodiments are directed to a method of operating a circuit to detect unstable memory cells from among a plurality of memory cells in at least one page. The method can include determining from an initial status of data stored in a memory cell whether no read error occurs when the data is read at a standard read voltage level, whether a read error occurs and the read error is correctable, and whether a read error occurs and the read error is uncorrectable. Responsive to determining that a read error occurs that is correctable, a further determination is made as to whether the memory cell is correctable by reading the data stored in the memory cell at a correction read voltage, which has a different voltage level from the standard read voltage level, and a determination is made as to whether a read error occurring in the data read at the correction read voltage level is correctable or uncorrectable. The determining whether the memory cell is correctable by reading the data stored in the memory cell is repetitively performed at a plurality of different correction read voltages.

Some other embodiments are directed to a memory system that includes a memory and a memory controller. The memory controller is configured to control the memory, wherein the memory controller reads data stored in a memory cell of the memory or data stored in a memory page of the memory cell of the memory using a standard read voltage level and reads the data stored in the memory cell of the memory or data stored in a memory page of the memory cell of the memory using a correction read voltage level that is different than the standard read voltage level, and is configured to determine data access by a host to the memory cell is to be allowed responsive to detecting whether a read error occurred in the memory cell when read at the correct read voltage level and when read at the standard read voltage level.

Some other embodiments are directed to a memory system that includes a solid state disc (SDD) and a memory controller. The SDD includes a plurality of memory cells. The memory controller is configured to write data in the SDD and to read the data from the SDD. The memory controller sequentially uses a standard write voltage to read data from the memory cells and uses a correction read voltage, which is different from the standard read voltage, to read data from the memory cells, and determines a distribution of read errors in the data read from the memory cells at the standard read voltage and at the correction read voltage, and determines whether data stored in the plurality of memory cells is valid responsive to the determined distribution of read errors.

The memory controller can include a central processing unit (CPU) and an error correction code (ECC) unit. The CPU supplies the standard read voltage to the SSD and determines the distribution of errors when the data is read using the standard read voltage. The ECC unit determines whether an error occurs in the data stored in the SSD from the determined distribution. Responsive to determining that an error occurred in the data stored in the SSD, the CPU determines whether the error is correctable or uncorrectable. Responsive to determining that the error is uncorrectable, the CPU instructs a host not to use the data stored in the memory cell. Responsive to determining that the error is correctable, the CPU supplies the correction read voltage to the SSD and determines the distribution of errors in the data read using the correction read voltage, and the ECC unit determines whether the error is correctable or uncorrectable according to the determined distribution of errors in the data read using the correction read voltage, and the CPU corrects the data stored in the SSD according to the determined distribution of errors.

The memory controller further can include a random access memory (RAM). When correcting the data stored in the SSD, the CPU stores the data stored in the memory cell in the RAM and then writes the data stored in the RAM again in the memory cell of the SSD.

The SSD can include a flash memory. Validity of the data stored in the SSD can be determined based on data included in one of sections of the SSD.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
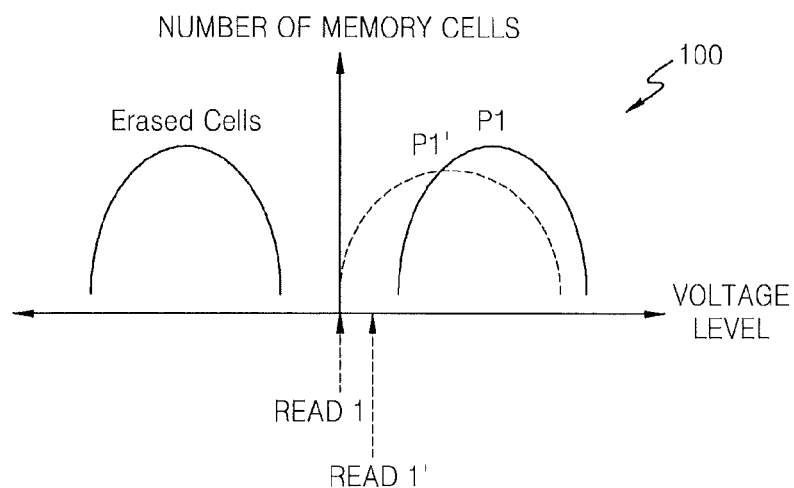
FIG. 1 illustrates the programming distribution of a least significant bit (LSB) page.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

According to some embodiments, the distribution of threshold voltages of memory cells is detected using a correction read voltage level that is different from a standard read voltage level used in a normal operating state and the validity of a programming operation of a corresponding memory cell is determined based on the detection result. Also, errors that may occur due to a change of environment of a memory device after occurrence of a problem during a programming operation or after a normal programming operation is performed, are checked in advance and measured.

FIG. 1 illustrates the programming distribution of a least significant bit (LSB) page. The LSB page is represented as logic high or logic low in a single level cell (SLC) or a multi-level cell (MLC). Normal distribution P1 indicated by a solid line represents the case where the LSB page is normally programmed, and abnormal distribution P1' indicated by a dotted line represents the case where a programming operation is abnormally performed or the programming operation is normally performed but the distribution varies due to environmental factors of a memory device. The horizontal axis represents voltage levels, and the vertical axis represents the number of memory cells corresponding to the voltage levels. The voltage levels of the memory cells are voltages used to turn on the memory cells, i.e., threshold voltages. The concept of the distribution is used because the basic unit for writing data stored in a memory cell is a page, and a plurality of memory cells are included in one page.

When the data stored in the memory cells correspond to the normal distribution P1, a read error does not occur when the data stored in the memory cells are read by using a standard read voltage level read1. In other words, the memory cells each having a threshold voltage corresponding to the standard read voltage level read1 are not found. In the normal distribution P1, there are no memory cells each having a threshold voltage corresponding to a correction read voltage level read1' that is different by a predetermined difference from the standard read voltage level read1. When the threshold voltages of the memory cells are not adjusted due to environmental factors of the memory cells after the programming operation is normally performed or charges accumulated on the floating gate do not leak, a read error does not occur even when the standard read voltage level read1 and the correction read voltage level read1' are corrected within a predetermined range, as described above.

However, in the abnormal distribution P1' in which the programming operation is abnormally programmed, errors may not occur when the data stored in the memory cells are read using the standard read voltage level read1. However, when the data stored in the memory cells are read using the correction read voltage level read1', a read error occurs. In other words, there are a plurality of memory cells each having a threshold voltage corresponding to the correction read voltage level read1'.

As described above, in normal memory cells, a read error occurs even when the standard read voltage level read1 and the correction read voltage level read1' are adjusted within a predetermined range. On the other hand, in abnormal memory cells, even when the standard read voltage level read1 and the correction read voltage level read1' are slightly adjusted, the probability that a read error may occur is increased. A difference between the correction read voltage level read1' and the standard read voltage level read1 may be determined according to a transistor to be used in the memory cells. The difference may be increased or decreased in steps of 0.05 V.

Figure 2:
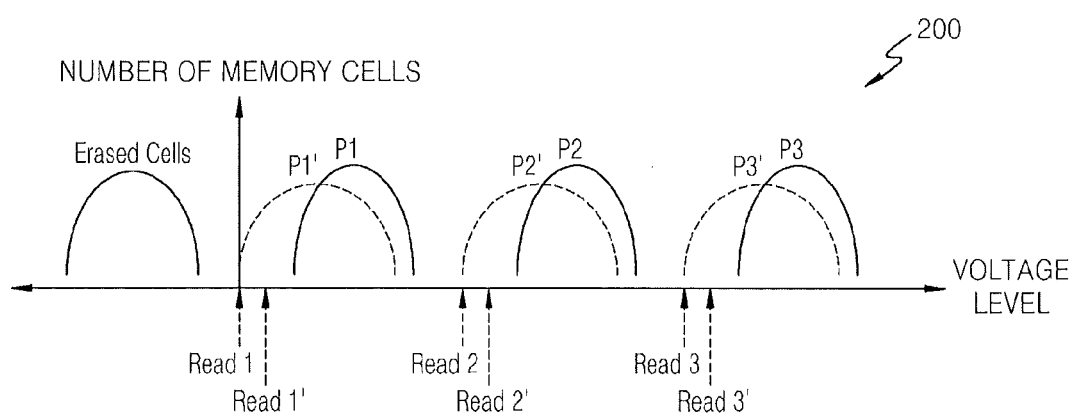
FIG. 2 illustrates the programming distribution of an LSB page and a most significant bit (MSB) page.

FIG. 2 illustrates the programming distribution of an LSB page and a most significant bit (MSB) page. The distribution illustrated in FIG. 2 is directed to an MSB or an LSB page in an MLC. Normal distributions P1, P2, and P3 indicated by a solid line represent the case where the MSB or LSB page is normally programmed, and abnormal distributions P1', P2', and P3' indicated by a dotted line represent the case where a programming operation is normally performed but distribution varies due to environmental factors of a memory device. The distribution of FIG. 2 is directed to multi-bits, and thus the distribution of each of multi-bits represents logic 00, 01, 10 or 11.

Referring to FIG. 2, in the normal distributions P1, P2, and P3 of memory cells that are normally programmed, there are no memory cells having threshold voltages corresponding to standard read voltage levels read1, read2, and read3, and correction read voltage levels read1', read2', and read3'. In the abnormal distributions P1, P2, and P3 of memory cells that are abnormally programmed, there are no memory cells having threshold voltages corresponding to the standard read voltage levels read1, read2, and read3, but there are memory cells having threshold voltages corresponding to the correction read voltage levels read1', read2', and read3'.

Referring to FIGS. 1 and 2, when environmental factors vary for normally-programmed memory cells or a memory system including the normally-programmed memory cells, if threshold voltages levels of the memory cells are hardly adjusted, a read error does not occur both in the case where data are read at the standard read voltage levels read1, read2, and read3 and in the case where data are read at the correction read voltage levels read1', read2', and read3'. However, when the threshold voltages levels of the memory cells are rapidly adjusted responsive to a change of the environmental factors of abnormally-programmed memory cells or a memory system including normally-programmed memory cells, a read error occurs. Hereinafter, various embodiments will now be described based on the above description.

Figure 3:
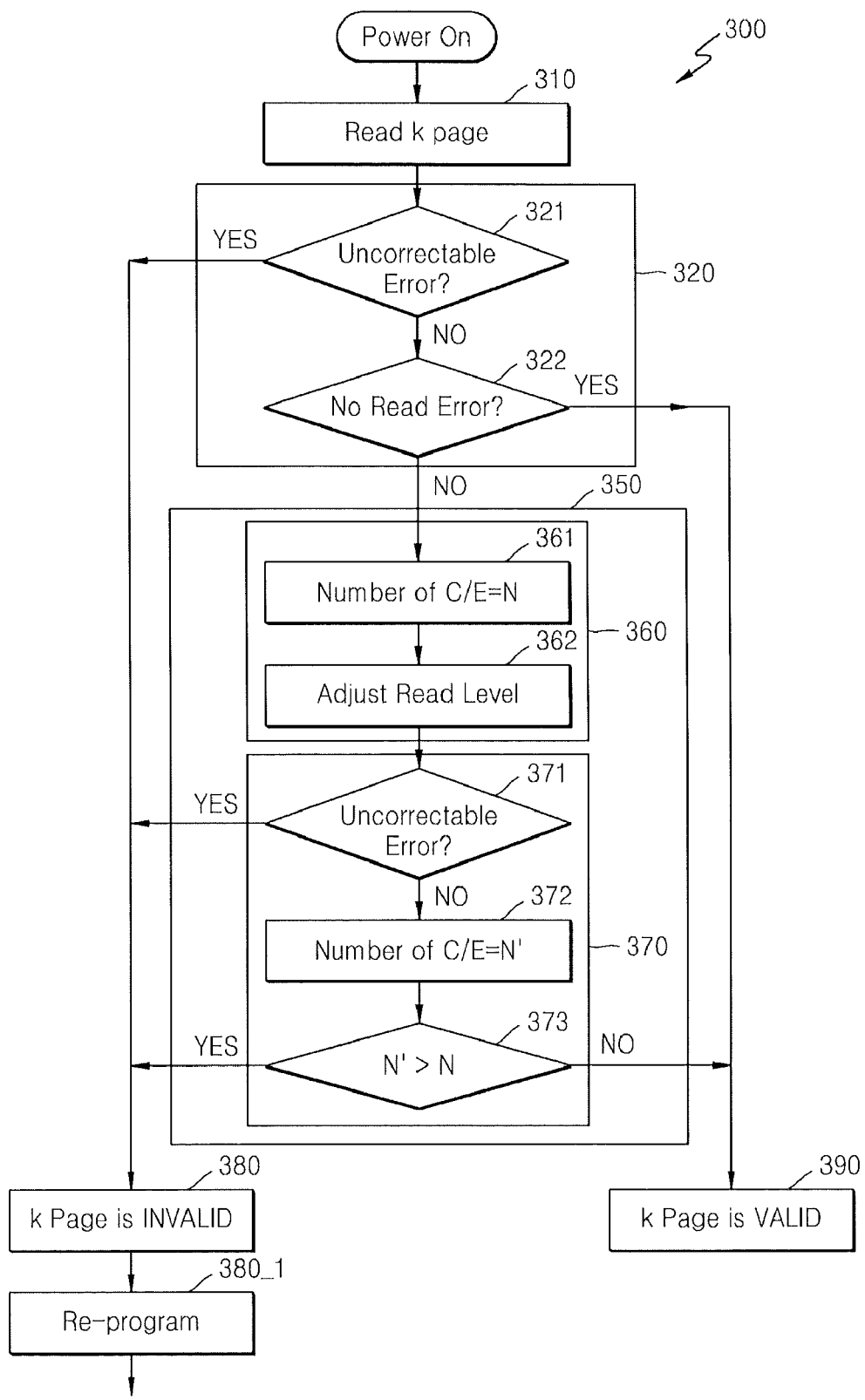
FIG. 3 is a flowchart illustrating methods of detecting the distribution of unstable memory cells according to some embodiments of the inventive concept.

FIG. 3 is a flowchart illustrating methods of detecting the distribution of unstable memory cells (300) according to some embodiments of the inventive concept. Referring to FIG. 3, the methods include reading data stored in memory cells (Operation 310), checking an initial status of the data (Operation 320), determining whether a read error is correctable (Operation 350), determining unused memory cells (Operation 380), re-programming memory cells that are determined to be unused memory cells (Operation 380-1), and determining stable memory cells (Operation 390).

In Operation 310, data stored in memory cells are read at standard read voltage levels.

In Operation 320, the data stored in the memory cells are read at the standard read voltage levels and a determination is made as to whether an error occurs. When a read error occurs, a further determination is made as to whether the read error is correctable or uncorrectable. Accordingly, Operation 320 includes a first determining of whether the read error is uncorrectable (Operation 321), and a second determining of whether there is no read error (Operation 322).

When it is determined in Operation 321 that the read error is uncorrectable, it is determined that data stored in a memory cell or a page in which the read error occurs are not used (Operation 380). In this case, re-programming memory cells that are determined as unused memory cells (Operation 380-1) is finally performed. If it is determined in Operation 321 that the read error is correctable, then there is either no read error or only a correctable read error remains. If it is determined in Operation 322 that there is no read error, then there is no problem in data stored in a memory cell or a page, and thus, the memory cell or page may be determined as being stable (Operation 390).

Operation 350 is subsequently performed when it is determined in Operation 320 that the read error is correctable. In Operation 350, the data stored in the memory cells are read at a correction read voltage level having a different level from the standard read voltage level, and a determination is made as to whether the read error is correctable or uncorrectable when the data stored in the memory cells are read at the correction write voltage level.

Operation 350 includes a first determining (Operation 360) and determining a correction read error (Operation 370).

Operation 360 includes determining the number N of memory cells in which a correctable read error occurs when the data stored in the memory cells are read at the standard read voltage level (Operation 361), and determining the correction read voltage level (Operation 362).

Operation 370 includes a third determining (Operation 371), a second determining (Operation 372), and a fourth determining (Operation 373). A determination is made as to whether a read error that occurs when the data stored in the memory cells are read using the correction read voltage level is correctable or uncorrectable.

In Operation 371, if it is determined that the read error that occurs when the data stored in the memory cell is uncorrectable, the data stored in the memory cell or the page is determined as not to be used (Operation 380) and a corresponding indicative signal may be generated and used to control programming of the memory cells.

In Operation 372, if it is determined that the read error is not uncorrectable, then the number N' of memory cells in which a correctable read error occurs when the data stored in the memory cells are read using the correction read voltage level.

In Operation 373, whether the number N' of the correctable memory cells determined in Operation 372 is larger than the number N of the correctable memory cells determined in Operation 360 (N'>N) is determined. Responsive to the determination in Operation 373, when the number N' of the correctable memory cells determined in Operation 372 is larger than the number N of the correctable memory cells determined in Operation 360 (N'>N), the data stored in the memory cell or the page is determined not to be used (Operation 380) and a corresponding indicative signal may be generated and used to control programming of the memory cells. In contrast, when the number N' of the correctable memory cells determined in Operation 372 is less than the number N of the correctable memory cells determined in Operation 360 (N'<N), the data stored in the memory cell or the page is determined as being stable (Operation 390) and a corresponding indicative signal may be generated and used to control programming of the memory cells.

As described above, detecting the distribution of unstable memory cells (300) may be more efficient when it is determined that the read error that occurs when the data stored in the memory cells are read using the standard write voltage level is correctable. In this case, the data stored in the memory cells are read once more using the correction read voltage level that is obtained by adjusting a read voltage level. The case where the data stored in the memory cells are read using the standard read voltage level and the case where the data stored in the memory cells are read using the correction read voltage level are compared with each other, and whether the memory cell or the page is to be used or to be re-programmed is determined. In other words, the number of correctable read errors that occur when the data stored in the memory cells are read using the standard read voltage level, and the number of correctable read errors that occur when the data stored in the memory cells are read using the correction read voltage level are compared with each other, and if the number of correctable read errors that occur when the data stored in the memory cells are read using the correction read voltage level is not less than the number of correctable read errors that occur when the data stored in the memory cells are read using the standard read voltage level, it is determined that the probability that uncorrectable read errors may occur in the memory cell or the page is considerably high, and adequate measures may be taken.

The above description refers to one memory cell or one page. Also, the correction read voltage level may be set at one arbitrary voltage level. However, the invention is not limited thereto as will be described below.

Figure 4:
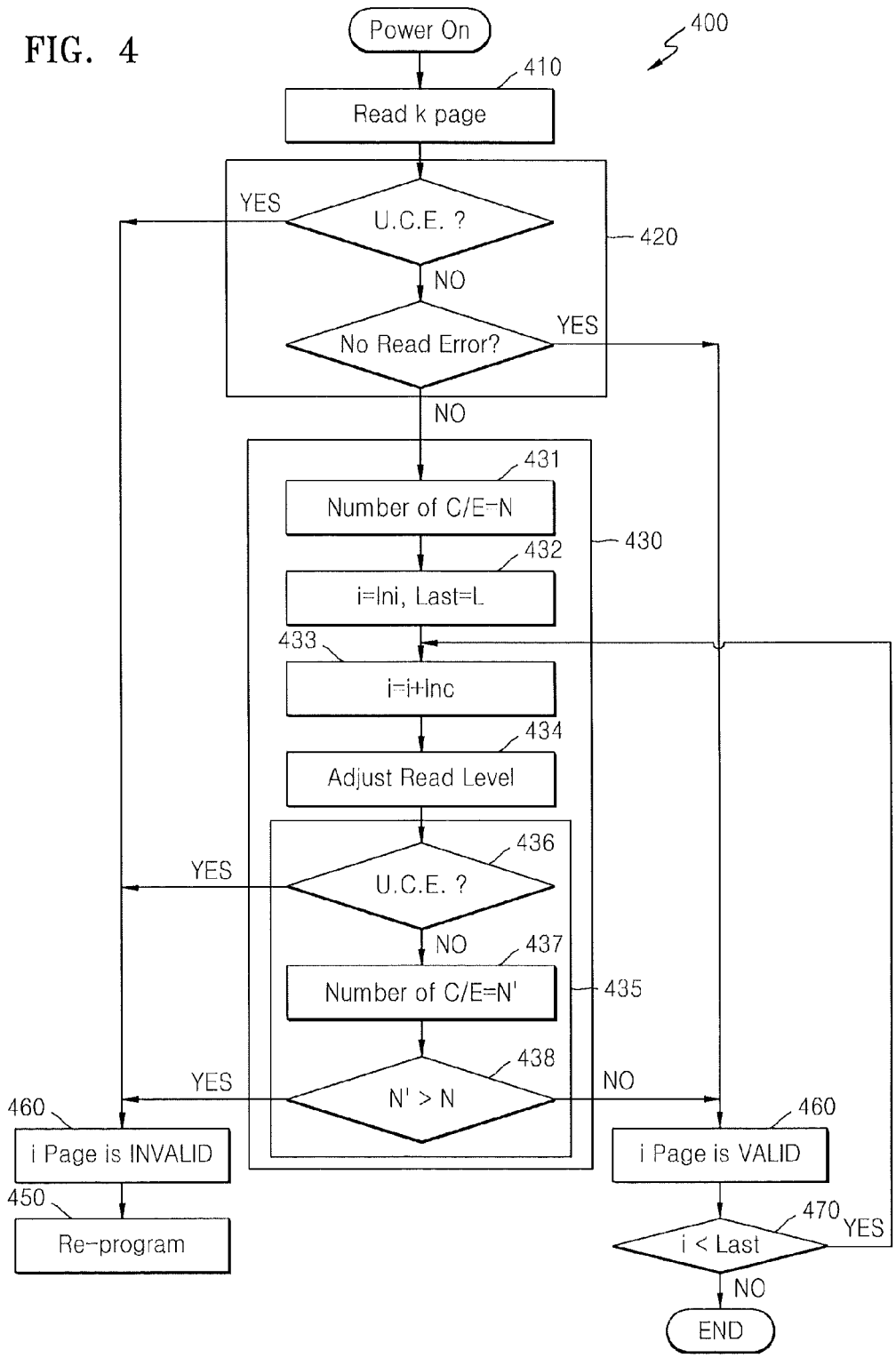
FIG. 4 is a flowchart illustrating methods of detecting the distribution of unstable memory cells including an operation of adjusting a correction read voltage level, according to some other embodiments of the inventive concept.

FIG. 4 is a flowchart illustrating methods of detecting the distribution of unstable memory cells (400) including an operation of adjusting a correction read voltage level, according to some other embodiments of the inventive concept. Referring to FIG. 4, detecting the distribution of unstable memory cells (400) may be performed using a plurality of correction read voltage levels having different voltage levels. Other operations correspond to various operations illustrated in FIG. 3, and thus, only reading data stored in a memory cell by adjusting a correction read voltage level (Operation 430) will now be described.

In Operation 430, the data stored in the memory cells are read while a predetermined voltage level Inc is sequentially added to or subtracted from a standard read voltage level Ini until the correction read voltage level becomes a last read voltage level LAST. Here, i is a variable, and L is an integer. U.C.E. means an uncorrectable error, and C/E means a correctable error.

Figure 5:
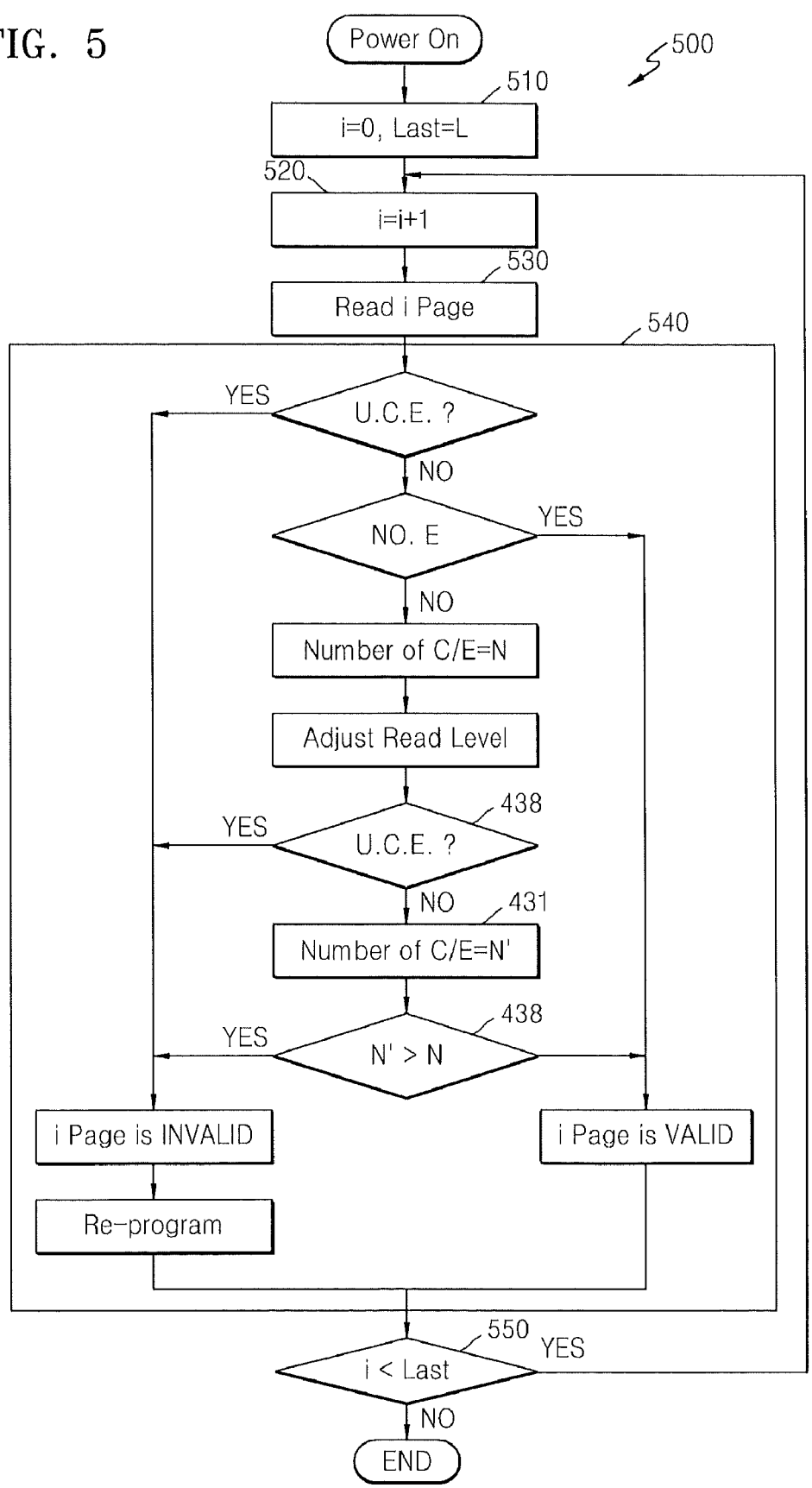
FIG. 5 is a flowchart illustrating methods of detecting the distribution of unstable memory cells including an operation of repeatedly performing a programming operation on a plurality of pages, according to some other embodiments of the inventive concept.

FIG. 5 is a flowchart illustrating methods of detecting the distribution of unstable memory cells (500) including an operation of repeatedly performing a programming operation on a plurality of pages, according to some other embodiments of the inventive concept. Referring to FIG. 5, detecting the distribution of unstable memory cells (500) may be easily performed on a plurality of pages L.

The flowcharts illustrated in FIG. 4 or 5 may be understood by one of ordinary skill in the art in view of the present application disclosure, and thus further detailed descriptions thereof will not be provided here. Also, one of ordinary skill in the art may combine FIGS. 4 and 5 into one flowchart in view of the present application disclosure, and thus, a detailed description of such a combination will not be provided here.

Figure 6:
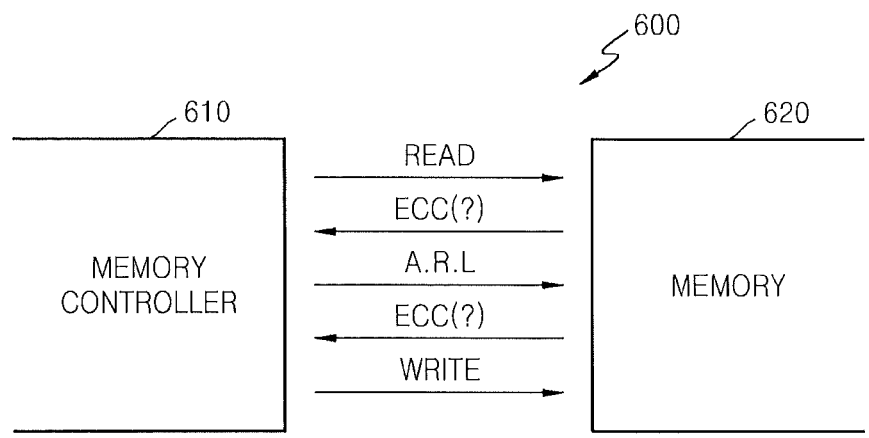
FIG. 6 is a block diagram of a memory system including a memory controller is configured to detect the distribution of unstable memory cells according to some embodiments of the inventive concept.

FIG. 6 is a block diagram of a memory system 600 including a memory controller circuit that is configured to detect the distribution of unstable memory cells, according to some embodiments of the inventive concept, and which can be configured to carry out the operations disclosed herein, including, but limited to, the operations of FIGS. 3, 4, and/or 5. Referring to FIG. 6, the memory system includes a memory controller 610 and a memory 620.

The memory controller 610 reads data that is stored in a memory cell included in the memory 620 or data stored in a memory page of the memory cell included in the memory 620 by using a standard read voltage level and a correction read voltage level, detects a read error that occurs in the memory cell, reads data stored in the memory cell after a read voltage level is adjusted, in order to perform a function of determining one of the case where the memory cell is used according to the result of detection and the case where data is to be newly stored in the memory cell, and detects a read error that occurs in the memory cell. According to the result of detection, whether the memory cell is to be used or a programming operation is to be newly performed on the memory cell is determined.

This procedure is described in the various operations for detecting the distribution of unstable memory cells illustrated in FIGS. 3, 4, and 5.

As described above, when it is determined that the programming operation has to be newly performed on the memory cell, the following three operations of processing pages including the distribution of unstable memory cells are performed.

Figure 7:
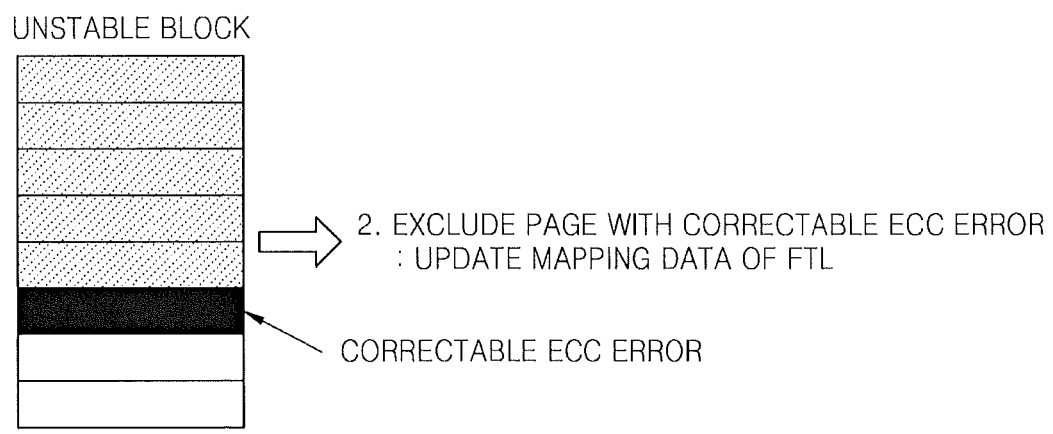
FIGS. 7 through 9 illustrate examples of processing pages including unstable memory cells.
Figure 8:
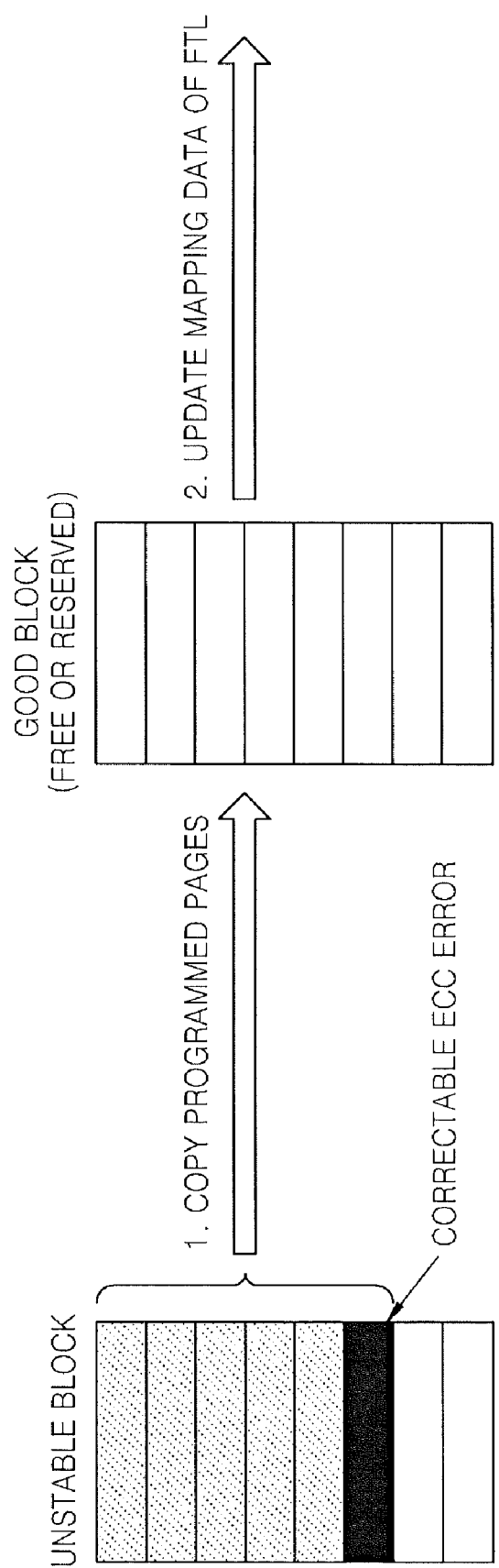
Figure 9:
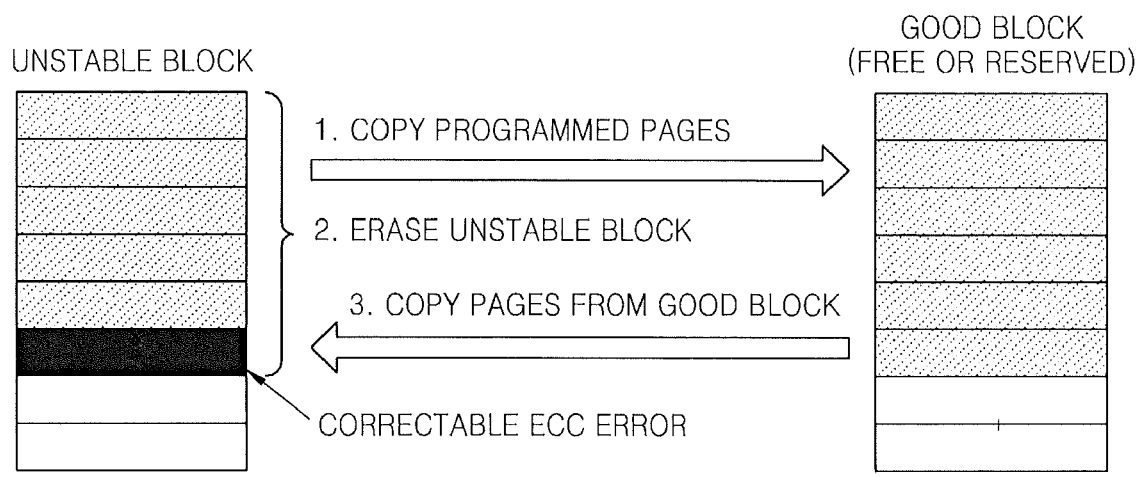

FIGS. 7 through 9 illustrate examples of processing pages including unstable memory cells. Referring to FIG. 7, which illustrates a first type of processing pages including the distribution of unstable memory cells, when power supply is suddenly cut off while a programming operation is performed in a page unit, data programmed at a page including a block in which a correctable ECC error occurs is determined as not to be used (2). In this case, the programming operation is performed once more on a local block address (LBA) data corresponding to a last write request at a time when power supply is cut off.

Referring to FIG. 8, which illustrates a second type of processing pages including the distribution of unstable memory cells, after data stored in a page including a block in which a correctable ECC error occurs is copied to internal surplus blocks, i.e., good blocks (1), information about physical position corresponding to the LBA is updated (2). In this case, a programming operation is not performed once more, and thus, the LBA at a write request at a time when power supply is cut off is determined to be normally processed.

Referring to FIG. 9, which illustrates a third type of processing pages including the distribution of unstable memory cells, data stored in a page including a block in which a correctable ECC error occurs is copied to a temporary buffer on a good block (1) and then is re-copied to original pages, i.e., unstable blocks (3). Before the re-copying (3) is performed, the data stored in the page on which an incomplete programming operation is performed may be deleted (2). In this case, information about physical position corresponding to the LBA does not have to be updated.

Figure 10:
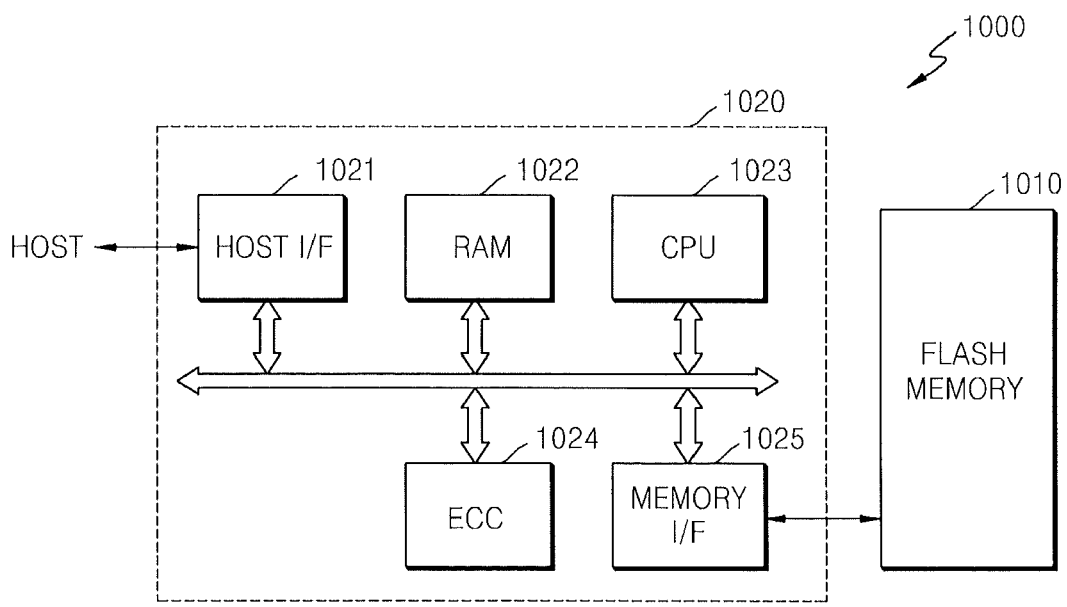
FIG. 10 is a memory system according to some other embodiments of the inventive concept.

FIG. 10 is a memory system 1000 according to some other embodiments of the inventive concept. Referring to FIG. 10, the memory system 1000 includes a memory controller 1020 and a solid state disc (SSD) 1010. The SSD 1010 may be implemented as a plurality of flash memory cells.

The memory controller 1020 is configured to write data in the SSD 1010 and to read the data written in the SSD 1010. Particularly, the memory controller 1020 applies a standard write voltage and a correction read voltage having a predetermined level difference with the standard read voltage to the SSD 1010, and analyzes the distribution of data stored in the SSD 1010 by using the standard read voltage and the correction read voltage, determines whether data stored in the SSD 1010 is valid, and corrects the data stored in the SSD 1010.

In order to perform the above-described functions, the memory controller 1020 includes a host interface (I/F) 1021, a random access memory (RAM) 1022, a central processing unit (CPU) 1023, an ECC unit 1024, and a memory I/F 1025. The host I/F 1021 interfaces between the memory controller 1020 and a host (not shown), and the memory IF 1025 interfaces between the memory controller 1020 and the SSD 1010.

The CPU 1023 transmits the standard read voltage to the SSD 1010 and analyzes the distribution of data according to the standard read voltage. The ECC unit 1024 determines whether there is an error in the data stored in the SSD 1010 from the distribution of the data, and if it is determined that there is an error in the data stored in the SSD 1010, the ECC unit 1024 further determines whether the error is correctable or uncorrectable.

When it is determined that the error is uncorrectable, the CPU 1023 instructs a host (not shown) that the data stored in the memory cell is not to be used. When it is determined that the error is correctable, the CPU 1023 transmits the correction read voltage to the SSD 1010, analyzes the distribution of the data according to the correction read voltage. The ECC unit 1024 determines whether the error is correctable or uncorrectable according to the result of analysis. The CPU 1023 corrects the data stored in the SSD 1010 according to the result of the determination.

The distribution of the data means the distribution of memory cells determined based on a standard read voltage level or a correction read voltage level. Exemplary distributions are illustrated in FIGS. 1 and 2.

The data stored in the SSD 1010 may be corrected using the CPU 1023 in various ways. As an example thereof, after the data stored in the memory cell of the SSD 1010 is stored in the RAM 1022, the data stored in the RAM 1022 is written again in the memory cell of the SSD 1010.

A plurality of memory cells included in the SSD 1010 are discriminated from one another in a page unit. Data are usually written in the plurality of memory cells in the page unit. In some embodiments, the validity of written data may be determined in the page unit.

In FIG. 10, functional blocks are illustrated that may be included in the memory controller 1020, and which may include the host interface 1021, the RAM 1022, the CPU 1023, the ECC 1024, and the memory interface 1025. It is to be understood that this exemplary embodiment is provided for convenience of explanation only and does not limit the scope of the invention.

While the inventive concept has been particularly shown and described with reference to exemplary embodiments thereof, it will be understood that various changes in form and details may be made therein without departing from the spirit and scope of the following claims.

What is claimed:

1. A method of operating a circuit to detect unstable memory cells from among a plurality of memory cells in at least one page, the method comprising:

determining from an initial status of data stored in a memory cell whether no read error occurs when the data is read at a standard read voltage level, whether a read error occurs and the read error is correctable, and whether a read error occurs and the read error is uncorrectable; and responsive to determining that a read error occurs that is correctable, further determining whether the memory cell is correctable by reading the data stored in the memory cell at a correction read voltage level, which has a different voltage level from the standard read voltage level, and by determining whether a read error occurring in the data read at the correction read voltage level is correctable or uncorrectable.

2. The method of claim 1, further comprising responding to a determination that no read error occurs by determining that data stored in the memory cell or in a page of the memory cell is stable, and responding to a determination that the read error is uncorrectable by determining that data stored in the memory cell or in the page of the memory cell is not to be used for data access by a host device.

3. The method of claim 2, wherein the determining from an initial status of data stored in a memory cell comprises:
   determining from the initial status of the data stored in the memory cell whether an uncorrectable read error has occurred; and
   responsive to determining that no uncorrectable read error has occurred, determining whether there is no read error.

4. The method of claim 1, wherein:
   the determining from an initial status of data stored in a memory cell comprises first determining a number of memory cells in which a correctable read error occurs when the data stored in the memory cells are read at the standard read voltage level; and
   the further determining whether the memory cell is correctable comprises determining whether a read error occurring when the data stored in the memory cells are read using the correction read voltage level is correctable or uncorrectable.

5. The method of claim 4, wherein the determining whether a read error occurring when the data stored in the memory cells are read using the correction read voltage level is correctable or uncorrectable comprises:
   determining whether the read error is uncorrectable;
   responsive to determining that read error is correctable, second determining a number of memory cells in which a correctable read error occurs when the data stored in the memory cells are read using the correction read voltage level; and
   determining whether the number of memory cells in which a correctable read error occurs when read at the correction read voltage level is larger than a number of memory cells in which a correctable read error occurs when read at the standard read voltage level.

6. The method of claim 5, further comprising:
   responsive to a determination that the read error is uncorrectable, determining that data in a memory cell or in a page of the memory is not to be used for data access by a host and restricting access by the host thereto;
   responsive to determining that the number of memory cells in which a correctable read error occurs when read at the correction read voltage level is larger than a number of memory cells in which a correctable read error occurs when read at the standard read voltage level, determining that the data stored in the memory cell or in the page of the memory cell is not to be used for data access by the host and restricting access by the host thereto; and
   responsive to the number of memory cells in which a correctable read error occurs when read at the correction read voltage level is less than the number of memory cells in which a correctable read error occurs when read at the standard read voltage level, determining that the data stored in the memory cell or in the page of the memory cell is stable and allowed to be accessed by the host.

7. The method of claim 1, wherein the determining from an initial status of data stored in a memory cell and the determining whether the memory cell is correctable are repeatedly performed on a plurality of pages.

8. The method of claim 1, wherein the determining whether the memory cell is correctable comprises repetitively reading the memory cell at a plurality of different voltage levels.

9. A method of operating a circuit to detect unstable memory cells from among a plurality of memory cells in at least one page, the method comprising:
   determining from an initial status of data stored in a memory cell whether no read error occurs when the data is read at a standard read voltage level, whether a read error occurs and the read error is correctable, and whether a read error occurs and the read error is uncorrectable;
   responsive to determining that a read error occurs that is correctable, further determining whether the memory cell is correctable by reading the data stored in the memory cell at a correction read voltage, which has a different voltage level from the standard read voltage level, and by determining whether a read error occurring in the data read at the correction read voltage level is correctable or uncorrectable; and
   repeatedly performing the determining whether the memory cell is correctable by reading the data stored in the memory cell at a plurality of different correction read voltages.

10. A memory system comprising:
    a memory; and
    a memory controller that is configured to control the memory, wherein the memory controller reads data stored in a memory cell of the memory or data stored in a memory page of the memory cell of the memory using a standard read voltage level and reads the data stored in the memory cell of the memory or data stored in a memory page of the memory cell of the memory using a correction read voltage level that is different than the standard read voltage level, and is configured to determine data access by a host to the memory cell is to be allowed responsive to detecting whether a read error occurred in the memory cell when read at the correct read voltage level and when read at the standard read voltage level.

11. A memory system comprising:
    a solid state disc (SDD) comprising a plurality of memory cells; and
    a memory controller that is configured to write data in the SDD and to read the data from the SDD,
    wherein the memory controller sequentially uses a standard write voltage to read data from the memory cells and uses a correction read voltage, which is different from the standard read voltage, to read data from the memory cells, and determines a distribution of read errors in the data read from the memory cells at the standard read voltage and at the correction read voltage, and determines whether data stored in the plurality of memory cells is valid responsive to the determined distribution of read errors.

12. The memory system of claim 11, wherein the memory controller comprises a central processing unit (CPU) and an error correction code (ECC) unit, wherein the CPU supplies the standard read voltage to the SSD and determines the distribution of errors when the data is read using the standard read voltage, and the ECC unit determines whether an error occurs in the data stored in the SSD from the determined distribution, and responsive to determining that an error occurred in the data stored in the SSD, the CPU determines whether the error is correctable or uncorrectable, and responsive to determining that the error is uncorrectable, the CPU instructs a host not to use the data stored in the memory cell, and responsive to determining that the error is correctable, the CPU supplies the correction read voltage to the SSD and determines the distribution of errors in the data read using the correction read voltage, and the ECC unit determines whether the error is correctable or uncorrectable according to the determined distribution of errors in the data read using the correction read voltage, and the CPU corrects the data stored in the SSD according to the determined distribution of errors.

13. The memory system of claim 12, wherein the memory controller further comprises a random access memory (RAM), and when correcting the data stored in the SSD, the CPU stores the data stored in the memory cell in the RAM and then writes the data stored in the RAM again in the memory cell of the SSD.

14. The memory system of claim 11, wherein the SSD comprises a flash memory.

15. The memory of claim 11, wherein validity of the data stored in the SSD is determined based on data included in one of sections of the SSD.

* * * * *